US012506241B2

(12) United States Patent
Taneda et al.

(10) Patent No.: US 12,506,241 B2
(45) Date of Patent: Dec. 23, 2025

(54) WIRING BOARD COMPRISING THREE OR MORE INSULATING LAYERS, WHERE A POST WALL WAVEGUIDE OF STAIRCASE SHAPE IS FORMED THEREIN

(71) Applicant: SHINKO ELECTRIC INDUSTRIES CO., LTD., Nagano (JP)

(72) Inventors: Hiroshi Taneda, Nagano (JP); Tatsuki Sumi, Nagano (JP); Yoko Nakabayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 179 days.

(21) Appl. No.: 18/526,349

(22) Filed: Dec. 1, 2023

(65) Prior Publication Data
US 2024/0332772 A1 Oct. 3, 2024

(30) Foreign Application Priority Data
Mar. 29, 2023 (JP) .................. 2023-054001

(51) Int. Cl.
*H01P 3/12* (2006.01)
*H01P 11/00* (2006.01)
(Continued)

(52) U.S. Cl.
CPC ............. *H01P 3/121* (2013.01); *H01P 3/122* (2013.01); *H01P 11/002* (2013.01);
(Continued)

(58) Field of Classification Search
CPC ..................................... H01P 3/121
(Continued)

(56) References Cited

U.S. PATENT DOCUMENTS

2003/0151476 A1* 8/2003 Salmela et al. ...... H05K 1/0219
333/245
2014/0168024 A1* 6/2014 Lee et al. ............... H01Q 13/10
343/767

FOREIGN PATENT DOCUMENTS

| JP | 2003-115704 | 4/2003 |
| JP | 2012-175624 | 9/2012 |
| WO | 2022/124038 | 6/2022 |

OTHER PUBLICATIONS

Office Action mailed on May 20, 2025 with respect to the corresponding Japanese patent application No. 2023-054001.

* cited by examiner

Primary Examiner — Benny T Lee
(74) Attorney, Agent, or Firm — IPUSA, PLLC

(57) ABSTRACT

A wiring board has a built-in post wall waveguide having a region surrounded by two mutually opposing conductors and first and second post walls connecting the two conductors and serving as a transmission path for electromagnetic waves. The conductors oppose each other with insulating layers interposed therebetween. The first post wall has first columnar portions, formed by a laminate of via interconnects penetrating the insulating layers, arranged at predetermined intervals in a first direction in which the electromagnetic waves are transmitted. The second post wall has second columnar portions similar to the first columnar portions. In a cross sectional view taken in a second direction perpendicular to the first direction, an interval between adjacent via interconnects in one of the insulating layers not in contact with the conductor is wider than an interval between adjacent via interconnects in two of the insulating layers in contact with the two conductors, respectively.

7 Claims, 11 Drawing Sheets

(51) Int. Cl.
*H05K 1/02* (2006.01)
*H05K 3/46* (2006.01)
(52) U.S. Cl.
CPC ......... *H05K 1/0237* (2013.01); *H05K 3/4682* (2013.01); *H05K 2201/09985* (2020.08); *H05K 2203/0723* (2013.01); *H05K 2203/107* (2013.01)
(58) Field of Classification Search
USPC ....................................................... 333/239
See application file for complete search history.

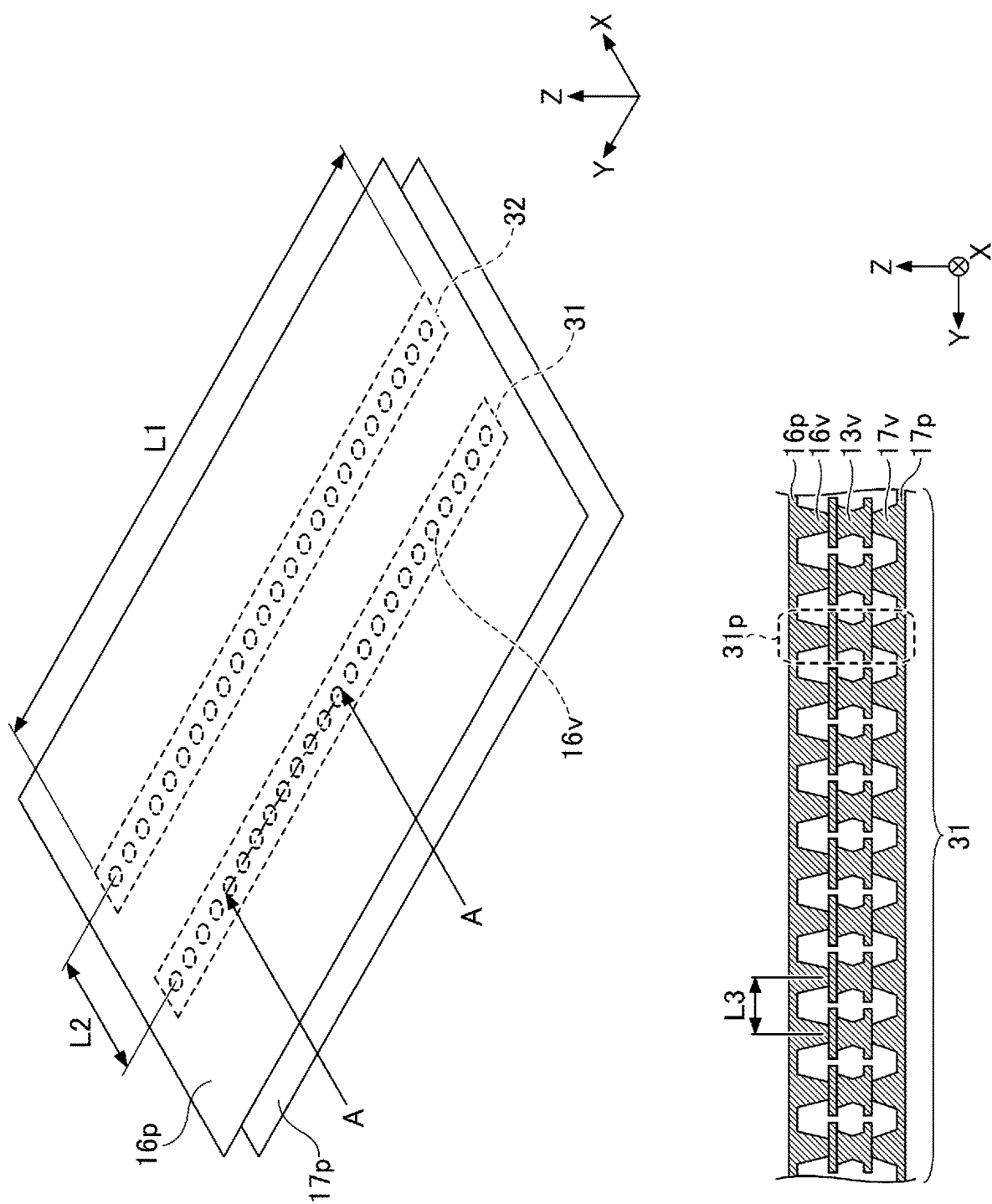

FIG.10
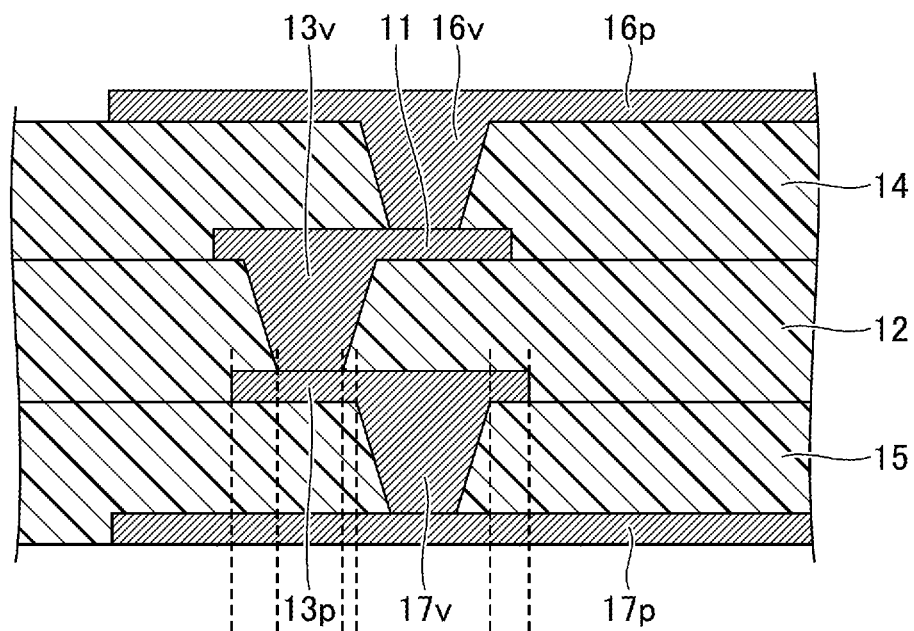
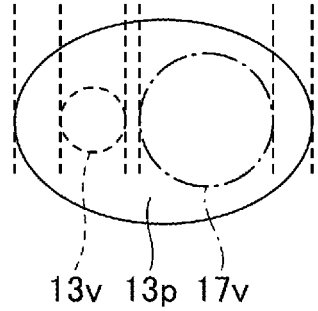

13p

13p

13p

WIRING BOARD COMPRISING THREE OR MORE INSULATING LAYERS, WHERE A POST WALL WAVEGUIDE OF STAIRCASE SHAPE IS FORMED THEREIN

CROSS-REFERENCE TO RELATED APPLICATIONS

This application is based upon and claims priority to Japanese Patent Application No. 2023-054001, filed on Mar. 29, 2023, the entire contents of which are incorporated herein by reference.

FIELD

Certain aspects of the embodiments discussed herein are related to wiring boards.

BACKGROUND

A technique called "post wall waveguide" has been proposed. The post wall waveguide includes side post walls and a rear post wall formed by a plurality of metal posts vertically penetrating a first region of a dielectric block, for example. The post wall waveguide further includes conductor films formed on upper and lower surfaces of at least the side post walls, the rear post wall, and the first region of the dielectric block in correspondence with a region surrounded by the side post walls and the rear post wall. An example of the post wall waveguide is proposed in Japanese Laid-Open Patent Publication No. 2012-175624 (now issued as Japanese Patent No. 5669043).

However, because the post wall waveguide has a shape close to a rectangular waveguide, there is room for improving radio wave transmission characteristics thereof.

SUMMARY OF THE INVENTION

Accordingly, it is an object in one aspect of the embodiments of the present disclosure to provide a wiring board that can improve radio wave transmission characteristics of a post wall waveguide integrated in the wiring board.

According to one aspect of the embodiments of the present disclosure, a wiring board includes a built-in post wall waveguide having a region, surrounded by two mutually opposing conductors and a first post wall and a second post wall connecting the two conductors, and serving as a transmission path for electromagnetic waves, wherein the two conductors are disposed to oppose each other with three or more insulating layers interposed therebetween, the first post wall has a configuration including first columnar portions, formed by a laminate of via interconnects penetrating the three or more insulating layers, arranged at predetermined intervals in a first direction in which the electromagnetic waves are transmitted, the second post wall has a configuration including second columnar portions, formed by a laminate of via interconnects penetrating the three or more insulating layers, arranged at predetermined intervals in the first direction, and in a cross sectional view taken in a second direction perpendicular to the first direction, the via interconnects forming the first columnar portion and the second columnar portion are laminated in a staircase shape, and an interval between adjacent first via interconnects opposing each other in one of the three or more insulating layers not in contact with one of the two conductors is wider than an interval between adjacent second via interconnects opposing each other in two of the three or more insulating layers in contact with the two conductors, respectively.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 2A and FIG. 2B are diagrams (part 2) illustrating the example of the wiring board according to the first embodiment;

FIG. 10 is a diagram illustrating an example of a via reception pad formed larger than a regular size.

DETAILED DESCRIPTION OF THE EMBODIMENTS

Figure 1A:
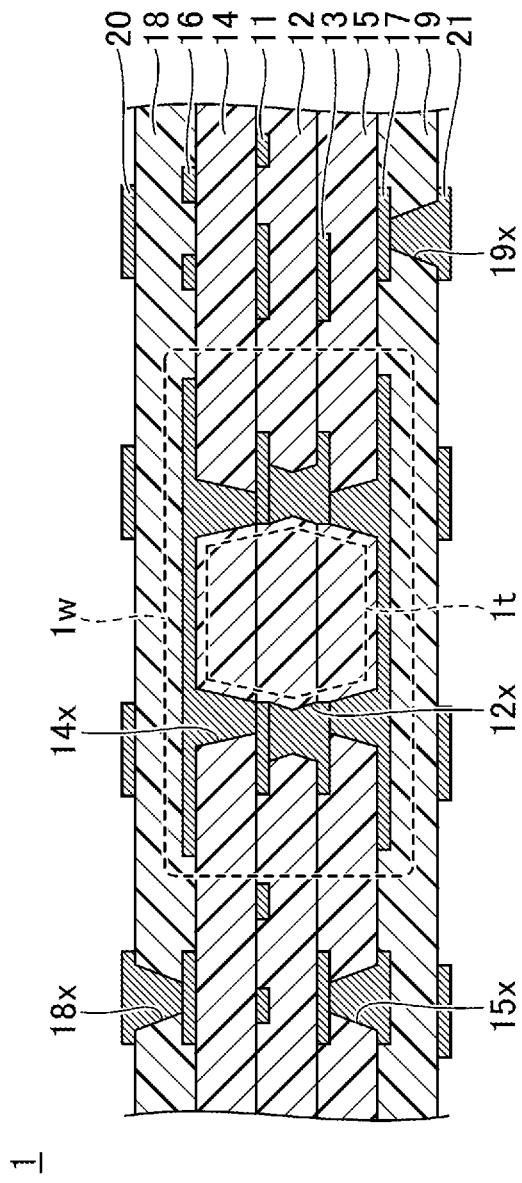
FIG. 1A and FIG. 1B are diagrams (part 1) illustrating an example of a wiring board according to a first embodiment.

Preferred embodiments of the present invention will be described with reference to the accompanying drawings. In the drawings and detail description thereof, those constituent elements that are the same are designated by the same reference numerals, and a repeated description of the same constituent elements may be omitted.

First Embodiment

[Overall Configuration of Wiring Board]

Figure 1B:
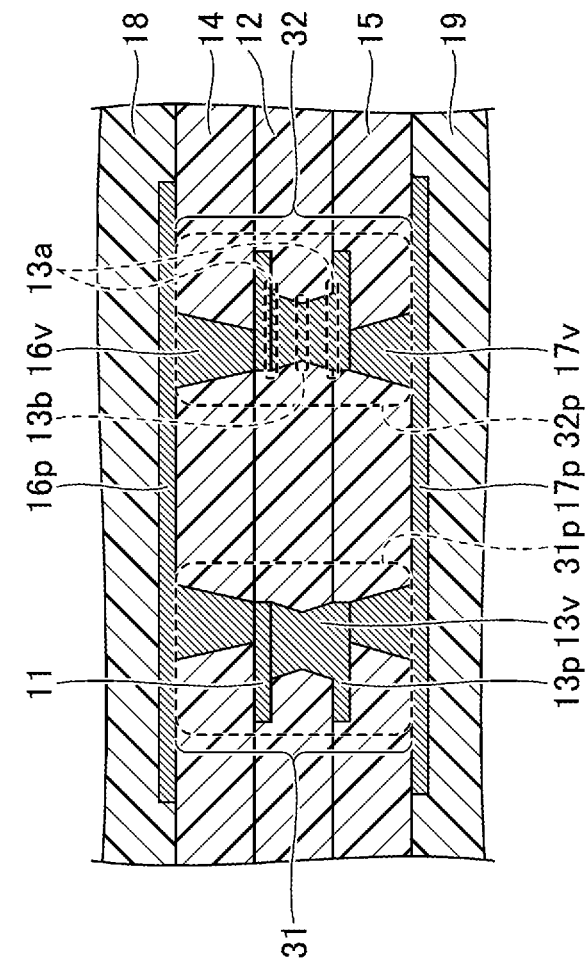

FIG. 1A and FIG. 1B are diagrams illustrating an example of a wiring board according to a first embodiment. FIG. 1A is a cross sectional view illustrating an overall configuration of a wiring board 1, and FIG. 1B is a longitudinal cross sectional view of a post wall waveguide $1w$ and a vicinity thereof in FIG. 1A.

As illustrated in FIG. 1A and FIG. 1B, the wiring board 1 includes an interconnect layer 11, an insulating layer 12, an interconnect layer 13, an insulating layer 14, an insulating layer 15, an interconnect layer 16, an interconnect layer 17, an insulating layer 18, an insulating layer 19, an interconnect layer 20, and an interconnect layer 21. The wiring board 1 may include, on the insulating layer 18, a solder resist layer that selectively exposes the interconnect layer 20. In addition, the wiring board 1 may include, on the insulating layer 19, a solder resist layer that selectively exposes the interconnect layer 21. The wiring board 1 includes the post wall waveguide 1w that is integrated therein. The post wall waveguide 1w will be described later.

In the present embodiment, for the sake of convenience, the side of the interconnect layer 20 of the wiring board 1 illustrated in FIG. 1A and FIG. 1B is also referred to as "an upper side" or "one side", and the side of the interconnect layer 21 of the wiring board 1 is also referred to as "a lower side" or "the other side". In addition, the surface of each portion on the side of the interconnect layer 20 is referred to as "an upper surface" or "one surface", and the surface of each portion on the side of the interconnect layer 21 is referred to as "a lower surface" or "the other surface". However, the wiring board 1 may be used in an upside-down state, or at an inclined state inclined at an arbitrary angle. Moreover, a plan view of an object refers to a view of the object viewed from above in a normal direction to one surface of the insulating layer 18, and a planar shape of the object refers to a shape of the object in the plan view viewed from above in the normal direction to the one surface of the insulating layer 18. In a case where the wiring board 1 in FIG. 1A and FIG. 1B is illustrated in an upside-down state, definitions of the upper surface and the lower surface become opposite to the above in accordance with the upside-down illustration.

In the wiring board 1, the interconnect layer 11 is embedded in the upper surface of the insulating layer 12. An upper surface of the interconnect layer 11 is exposed from the upper surface of the insulating layer 12, and a lower surface and a side surface of the interconnect layer 11 are covered by the insulating layer 12. The interconnect layer 11 includes interconnect patterns, and via reception pads. A planar shape of the pads is a circular shape having a diameter in a range of approximately 60 µm to approximately 120 µm, for example. A material used for the interconnect layer 11 may be copper (Cu) or the like, for example. The interconnect layer 11 may have a laminated structure formed by a plurality of metal layers. A thickness of the interconnect layer 11 may be in a range of approximately 10 µm to approximately 30 µm, for example.

The insulating layer 12 is formed so as to cover the side surface and the lower surface of the interconnect layer 11. The upper surface of the insulating layer 12 may coincide with the upper surface of the interconnect layer 11, for example. A material used for the insulating layer 12 may be an insulating resin or the like including an epoxy resin or a polyimide resin as a main component thereof, for example. A thickness of the insulating layer 12 may be in a range of approximately 20 µm to approximately 30 µm, for example. The thickness of the insulating layer 12 is the distance from the lower surface of the interconnect layer 11 to the lower surface of the insulating layer 12. The same applies to the thicknesses of the other insulating layers or the like which will be described later. The insulating layer 12 may include a filler, such as silica (SiO$_2$) or the like.

The interconnect layer 13 includes via interconnects 13v filling via holes 12x that penetrate the insulating layer 12 and expose the lower surface of the interconnect layer 11, and interconnect patterns 13p formed on the lower surface of the insulating layer 12. The interconnect patterns 13p may include via reception pads. In the longitudinal cross sectional view illustrated in FIG. 1B, the via interconnects 13v may have an hourglass shape such that a width thereof gradually narrows from wide portions 13a located at both the upper and lower surfaces of the insulating layer 12 toward a narrow portion 13b located at a center along a thickness direction of the insulating layer 12. The interconnect layer 13 is electrically connected to the interconnect layer 11 that is exposed at bottoms of the via holes 12x. A material used for the interconnect layer 13 and a thickness of the interconnect patterns 13p of the interconnect layer 13 may be the same as those of the interconnect layer 11, for example.

The insulating layer 14 is disposed on the upper surface of the insulating layer 12, and covers the upper surface of the interconnect layer 11. A material used for the insulating layer 14 and a thickness of the insulating layer 14 may be the same as those of the insulating layer 12, for example. The insulating layer 14 may include a filler, such as silica (SiO$_2$) or the like.

The insulating layer 15 is disposed on the lower surface of the insulating layer 12, and covers a lower surface and a side surface of the interconnect layer 13. A material used for the insulating layer 15 and a thickness of the insulating layer 15 may be the same as those of the insulating layer 12, for example. The insulating layer 15 may include a filler, such as silica (SiO$_2$) or the like.

The interconnect layer 16 includes via interconnects 16v filling via holes 14x that penetrate the insulating layer 14 and expose the upper surface of the interconnect layer 11, and interconnect patterns formed on an upper surface of the insulating layer 14. The interconnect patterns of the interconnect layer 16 include a conductor 16p. The interconnect patterns of the interconnect layer 16 may include via reception pads. The via interconnects 16v may have a shape such that a width thereof narrows in a downward direction away from the conductor 16p. For example, the via interconnects 16v may have an inverted truncated cone shape having a diameter at the insulating layer 18 greater than a diameter at the upper surface of the interconnect layer 11. The interconnect layer 16 is electrically connected to the interconnect layer 11 that is exposed at the bottoms of the via holes 14x. A material used for the interconnect layer 16 and a thickness of the interconnect patterns of the interconnect layer 16 may be the same as those of the interconnect layer 11, for example.

The interconnect layer 17 includes via interconnects 17v filling via holes 15x that penetrate the insulating layer 15 and expose the lower surface of the interconnect layer 13, and interconnect patterns formed on a lower surface of the insulating layer 15. The interconnect patterns of the interconnect layer 17 include a conductor 17p. The interconnect patterns of the interconnect layer 17 may include via reception pads. The via interconnects 17v may have a shape such that a width thereof narrows in an upward direction away from the conductor 17p. For example, the via interconnects 17v may have a truncated cone shape having a diameter at the insulating layer 19 greater than a diameter at the lower surface of the interconnect layer 13. The interconnect layer 17 is electrically connected to the interconnect layer 13 that is exposed at bottoms of the via hole 15x. A material used for the interconnect layer 17 and a thickness of the interconnect patterns of the interconnect layer 17 may be the same as those of the interconnect layer 11, for example.

The insulating layer 18 is disposed on the upper surface of the insulating layer 14, and covers an upper surface and a side surface of the interconnect layer 16. A material used for the insulating layer 18 and a thickness of the insulating layer 18 may be the same as those of the insulating layer 12, for example. The insulating layer 18 may include a filler, such as silica ($SiO_2$) or the like.

The insulating layer 19 is disposed on the lower surface of the insulating layer 15, and covers a lower surface and a side surface of the interconnect layer 17. A material used for the insulating layer 19 and a thickness of the insulating layer 19 may be the same as those of the insulating layer 12, for example. The insulating layer 19 may include a filler, such as silica ($SiO_2$) or the like.

The interconnect layer 20 includes via interconnects filling via holes 18x that penetrate the insulating layer 18 and expose the upper surface of the interconnect layer 16, and interconnect patterns formed on an upper surface of the insulating layer 18. The via interconnects of the interconnect layer 20 may have an inverted truncated cone shape having a diameter at the interconnect layer 20 larger than a diameter at the upper surface of the interconnect layer 16. The interconnect layer 20 is electrically connected to the interconnect layer 16 that is exposed at bottoms of the via holes 18x. A material used for the interconnect layer 20 and a thickness of the interconnect patterns of the interconnect layer 20 may be the same as those of the interconnect layer 11, for example.

The interconnect layer 21 includes via interconnects filling via holes 19x that penetrate the insulating layer 19 and expose the lower surface of the interconnect layer 17, and interconnect patterns formed on a lower surface of the insulating layer 19. The via interconnects of the interconnect layer 21 may have a truncated cone shape having a diameter at the interconnect layer 21 greater than a diameter at the lower surface of the interconnect layer 17. The interconnect layer 21 is electrically connected to the interconnect layer 17 that is exposed at bottoms of the via holes 19x. A material used for the interconnect layer 20 and a thickness of the interconnect patterns of the interconnect layer 20 may be the same as those of the interconnect layer 11, for example.

[Post Wall Waveguide]

FIG. 2A and FIG. 2B are diagrams illustrating the example of the wiring board according to the first embodiment. FIG. 2A is a perspective view of the post wall waveguide 1w of FIG. 1A, and FIG. 2B is a longitudinal cross sectional view taken along a line A-A in FIG. 2A. The post wall waveguides 1w will be described with reference to FIG. 1A, FIG. 1B, FIG. 2A and FIG. 2B.

As illustrated in FIG. 1A, FIG. 1B, FIG. 2A and FIG. 2B, the wiring board 1 has the built-in post wall waveguide 1w in which a region surrounded by two conductors 16p and 17p opposing each other in the Z-direction and a first post wall 31 and a second post wall 32 connecting the two conductors 16p and 17p, serves as a transmission path 1t for electromagnetic waves. In the example illustrated in FIG. 1A through FIG. 2B, a direction in which the electromagnetic waves are transmitted is the Y-direction. The transmission path 1t is not limited to a linear path, and may be a curved path, or may include a mixture of both a linear path and a curved path.

The conductor 16p is a part of the interconnect patterns of the interconnect layer 16, and the conductor 17p is a part of the interconnect patterns of the interconnect layer 17. The conductor 16p and the conductor 17p are disposed to oppose each other in the Z-direction with the insulating layers 15, 12, and 14 interposed therebetween. The conductors 16p and 17p are solid rectangular patterns opposing each other as illustrated in FIG. 2A, for example.

The first post wall 31 has a configuration in which a first columnar portion 31p formed by a laminate of a via interconnect 17v penetrating the insulating layer 15, a via interconnect 13v penetrating the insulating layer 12, and a via interconnect 16v penetrating the insulating layer 14, is arranged at predetermined intervals in the Y-direction in which the electromagnetic waves are transmitted, as illustrated in FIG. 2A and FIG. 2B. In addition, the second post wall 32 has a configuration in which a second columnar portion 32p formed by a laminate of a via interconnect 17v penetrating the insulating layer 15, a via interconnect 13v penetrating the insulating layer 12, and a via interconnect 16v penetrating the insulating layer 14, is arranged at predetermined intervals in the Y-direction in which the electromagnetic waves are transmitted, similar to the first columnar portion 31p. A length L1 of each of the first post wall 31 and the second post wall 32 in the Y-direction may be 5 mm, for example.

The first post wall 31 and the second post wall 32 oppose each other at predetermined intervals in the X-direction. An interval L2 between the first post wall 31 and the second post wall 32 in the X-direction may be 0.82 mm, for example. The interval L2 (FIG. 2A) between the first post wall 31 and the second post wall 32 in the X-direction is defined at a position where the interval in the X-direction is widest in the thickness direction.

In the longitudinal cross section illustrated in FIG. 2B, center axes of the via interconnects 17v, 13v, and 16v forming the first columnar portion 31p approximately coincide. Similarly, center axes of the via interconnects 17v, 13v, and 16v forming the second columnar portion 32p approximately coincide. A pitch L3 (FIG. 2B) in the Y-direction of each of the first columnar portion 31p and the second columnar portion 32p may be 0.125 mm, for example. Frequencies of the electromagnetic waves that can be transmitted through the transmission path 1t may be in a range of 150 GHz to 160 GHz, for example.

In a longitudinal cross sectional view cut along a direction perpendicular to the direction in which the electromagnetic waves are transmitted, that is, in the longitudinal cross section illustrated in FIG. 1B, the via interconnects forming the first columnar portion 31p and the second columnar portion 32p are laminated in a staircase shape. The staircase shape refers to a shape such that the center axes of the via interconnects adjacent to each other in a vertical direction do not coincide with each other. In other words, in the laminated structure of the via interconnects forming the first columnar portion 31p and the second columnar portion 32p, a staggered configuration is employed in which the via interconnects adjacent to each other in the vertical direction do not overlap each other at the same position in the plan view.

The interval of the via interconnects 13v opposing each other in the X-direction in the insulating layer 12 not making contact with the conductors 16p and 17p, is larger than the interval of the via interconnects 16v opposing each other in the X-direction in the insulating layer 14 making contact with the conductor 16p. In addition, the interval of the via interconnects 13v opposing each other in the X-direction in the insulating layer 12 not making contact with the conductors 16p and 17p, is larger than the interval of the via interconnects 17v opposing each other in the X-direction in the insulating layer 15 making contact with the conductor 17p. The interval of the via interconnects 16v opposing each other in the X-direction in the insulating layer 14 making contact with the conductor 16p, may be the same as the interval of the via interconnects 17v opposing each other in the X-direction in the insulating layer 15 making contact with the conductor 17p.

It is assumed that the interval of the via interconnects opposing each other in the X-direction is defined at a position where the interval in the X-direction is widest. For example, the interval of the via interconnects 16v opposing each other in the X-direction is defined by an interval of lower ends of the via interconnects 16v making contact with the upper surface of the insulating layer 12. Moreover, the interval of the via interconnects 13v opposing each other in the X-direction is defined by an interval of the narrow portions 13b.

In the longitudinal cross section illustrated in FIG. 1B, the first columnar portion 31p and the second columnar portion 32p have a bilaterally symmetrical structure, for example. Further, in the longitudinal cross section illustrated in FIG. 1B, the first columnar portion 31p and the second columnar portion 32p have a vertically symmetrical structure, for example.

Accordingly, the interval in the X-direction of the first columnar portion 31p and the second columnar portion 32p forming the post wall waveguide 1w is widest near the center along the thickness direction, and becomes narrower toward the conductors 16p and 17p. For this reason, the transmission path 1t has a shape close to a circular waveguide, and thus, it is possible to improve the transmission characteristics of the radio waves compared to a shape close to a rectangular waveguide in which the interval in the X-direction of the first columnar portion 31p and the second columnar portion 32p is constant along the thickness direction.

In the longitudinal cross section illustrated in FIG. 1B, the sides of the via interconnects 16v and 13v opposing the transmission path 1t (FIG. 1A) are preferably inclined in the same direction, from the end of the via interconnect 16v at the conductor 16p to the narrow portion 13b. In addition, the sides of the via interconnects 17v and 13v opposing the transmission path it are preferably inclined in the same direction, from the end of the via interconnect 17v at the conductor 17p to the narrow portion 13b. Hence, because the transmission path 1t has a shape close to the circular waveguide, it is possible to further improve the transmission characteristics of the radio waves.

In the longitudinal cross section illustrated in FIG. 1B, the lower ends of the via interconnects 16v forming the first columnar portion 31p and the second columnar portion 32p are preferably unevenly distributed in a region close to the transmission path 1t and connected to upper surfaces of the via reception pads of the interconnect layer 11. In addition, the upper ends of the via interconnects 17v forming the first columnar portion 31p and the second columnar portion 32p are preferably unevenly distributed in a region close to the transmission path 1t and connected to surfaces of the via reception pads of the interconnect layer 13. Further, the upper ends of the via interconnects 13v forming the first columnar portion 31p and the second columnar portion 32p are unevenly distributed in a region close to the transmission path 1t and connected to lower surfaces of the via reception pads of the interconnect layer 11. Accordingly, the via reception pads do not protrude into the transmission path 1t, and it is possible to further improve the transmission characteristics of the radio waves because the transmission path 1t has a shape close to the circular waveguide.

In the wiring board 1, the number of insulating layers may be any number greater than or equal to three.

Moreover, the wiring board 1 does not necessarily have to include the insulating layers and the interconnect layers at portions other than the portion forming the post wall waveguide 1w. That is, the wiring board 1 itself may be the post wall waveguide 1w.

Further, the wiring board 1 may have a semiconductor chip mounted thereon or built therein. The chip can transmit and/or receive electromagnetic waves transmitted through the transmission path 1t, for example.

[Method for Manufacturing Wiring Board]

Next, a method for manufacturing the wiring board according to the first embodiment will be described. FIGS. 3A to 3D, FIGS. 4A to 4D and FIGS. 5A to 5C are diagrams illustrating an example of manufacturing processes of the wiring board according to the first embodiment. In this example, the processes (or steps) of forming a layer structure only on one side of a support is illustrated, but the processes (or steps) may form the layer structure on one side and the other side of the support. In FIG. 3A through FIG. 5C, a broken line C indicates a position where the wiring board is cut and singulated into individual pieces. A region located between two adjacent broken lines C in the cross sectional view is finally singulated into the individual piece to form one wiring board.

Figure 3A:
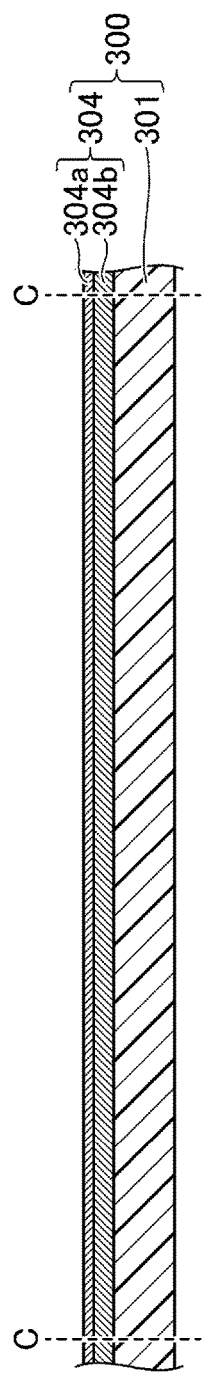
FIG. 3A, FIG. 3B, FIG. 3C, and FIG. 3D are diagrams illustrating an example of manufacturing processes of the wiring board according to the first embodiment.

First, in the process illustrated in FIG. 3A, a support 300 is prepared. The support 300 has a structure in which a copper foil 304, attached with a carrier, is laminated on one side of a core substrate 301, for example. The core substrate 301 is a resin substrate having a thickness of approximately 0.7 mm, for example, and may include a reinforcing member, such as glass fiber or the like. The copper foil 304 has a structure in which a thin foil 304a formed of copper (Cu) and having a thickness in a range of approximately 1.5 μm to 5 μm, for example, is strippably adhered to a thick foil (carrier foil) 304b formed of copper (Cu) and having a thickness in a range of approximately 10 μm to 50 μm, for example, via a stripping layer (not illustrated). The thick foil 304b is provided as a support material for facilitating handling of the thin foil 304a.

The structure of the support 300 illustrated in FIG. 3A is an example, and the structure of the support 300 is not limited to the illustrated structure. For example, in the support 300, a laminated structure including a plurality of laminated prepregs may be used in place of the core substrate 301. In addition, the support 300 may have a structure in which the copper foil 304, attached with a carrier, is disposed on one side of a glass substrate, a metal substrate, or the like, with a stripping layer interposed therebetween.

Figure 3B:
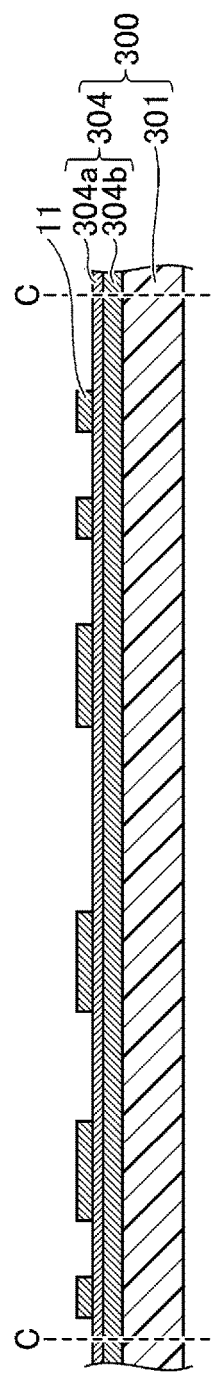

Next, in the process illustrated in FIG. 3B, the interconnect layer 11 is formed on the support 300. Particularly, a resist layer having an opening at a portion where the interconnect layer 11 is to be formed is formed on an upper surface of the copper foil 304 (upper surface of the thin foil 304a), using a dry film resist or the like. Then, the interconnect layer 11, which is an electrolytic plating layer, is formed on the upper surface of the copper foil 304 exposed inside the opening in the resist layer, by electrolytic plating using the copper foil 304, which is a metallic layer, as a power feeding layer. The material used for the interconnect layer 11 and the thickness of the interconnect layer 11 are as described above. Thereafter, the resist layer is stripped and removed.

Figure 3C:
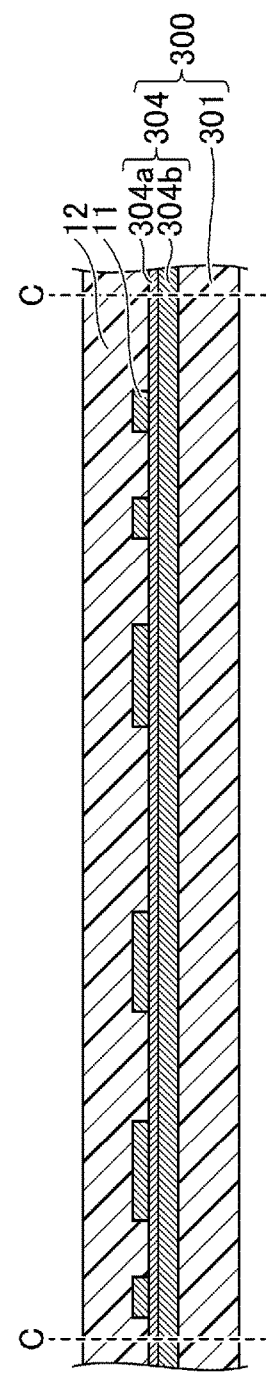

Next, in the process illustrated in FIG. 3C, the insulating layer 12 is formed on the support 300, so as to cover a surface of the interconnect layer 11 that is not in contact with the support 300. Particularly, the insulating layer 12 that covers the interconnect layer 11 is formed on the upper surface of the copper foil 304. First, an insulating resin film in a semi-cured state, including a thermosetting resin as a main component thereof, for example, is prepared. Then, the insulating resin is laminated on the upper surface of the copper foil 304, and cured while being subjected to heating and pressing, to form the insulating layer 12. Alternatively, instead of laminating the insulating resin film, a liquid or paste of the insulating resin may be coated on the upper surface of the copper foil 304, and cured to form the insulating layer 12. The material used for the insulating layer 12 and thickness of the insulating layer 12 are as described above.

Figure 3D:
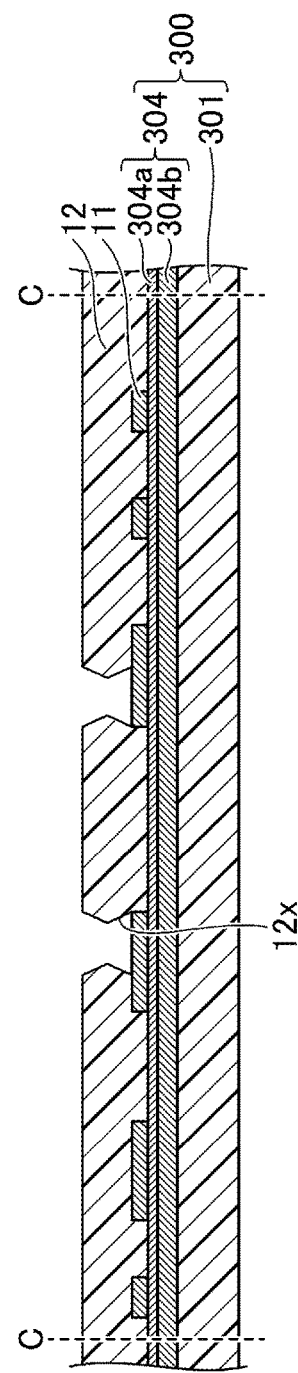

Next, in the process illustrated in FIG. 3D, the via holes 12x are formed in the insulating layer 12, penetrating the insulating layer 12 and exposing the upper surface of the interconnect layer 11. The via holes 12x can be formed by laser beam machining using a $CO_2$ laser, a YAG laser, an excimer laser, or the like, for example. After forming the via holes 12x, a desmear process is preferably performed to remove resins residue adhered to the surface of the interconnect layer 11 exposed at the bottoms of the via holes 12x.

The via hole 12x may have an hourglass shape, for example. The hourglass shape can be formed by adjusting a power of a laser beam irradiated on the insulating layer 12. By adjusting the power of the laser beam, a portion of the laser beam is reflected by the upper surface of the interconnect layer 11 toward the insulating layer 12, thereby forming the hourglass shape as illustrated in FIG. 3D.

Figure 4A:
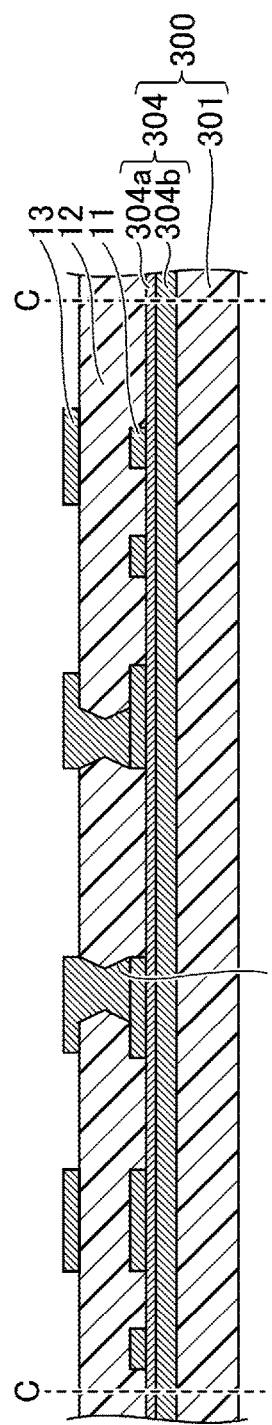
FIG. 4A, FIG. 4B, FIG. 4C, and FIG. 4D are diagrams illustrating the example of the manufacturing processes of the wiring board according to the first embodiment.

Next, in the process illustrated in FIG. 4A, the interconnect layer 13 is formed on the insulating layer 12. The interconnect layer 13 can be formed by a semi-additive method, for example. Particularly, a seed layer continuously covering the upper surface of the insulating layer 12, inner surfaces of the via holes 12x, and the upper surface of the interconnect layer 11 exposed inside the via holes 12x, is formed by electroless plating of copper (Cu) or sputtering of copper (Cu), for example. Next, a resist layer having an opening corresponding to the shape of the interconnect layer 13 is formed on the seed layer. Then, an electrolytic plating layer is formed on the seed layer exposed inside the opening in the resist layer, by electrolytic plating using the seed layer as a power feeding layer. Next, after removing the resist layer, the seed layer exposed from the electrolytic plating layer is removed by etching, thereby forming the interconnect layer 13 having the electrolytic plating layer laminated on the seed layer.

Figure 4B:
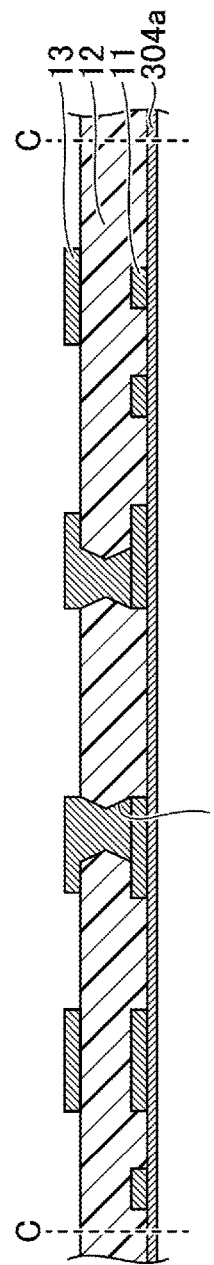
Figure 4C:
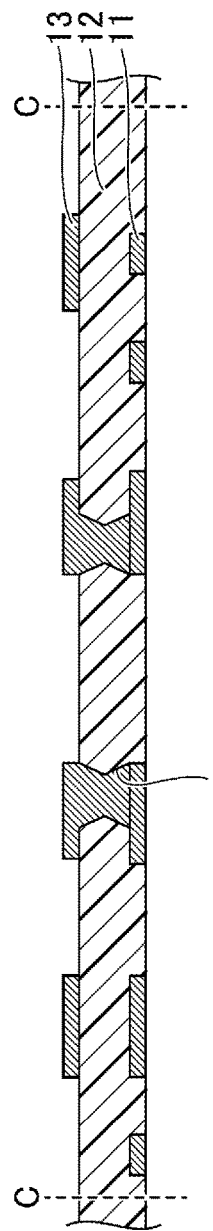

Next, in the processes illustrated in FIG. 4B and FIG. 4C, the support 300 illustrated in FIG. 4A is removed. First, in order to remove the support 300, the core substrate 301 and the thick foil 304b are mechanically stripped from the thin foil 304a, as illustrated in FIG. 4B. Then, as illustrated in FIG. 4C, the thin foil 304a is removed by wet etching using a ferric chloride aqueous solution, a cupric chloride aqueous solution, an ammonium persulfate aqueous solution, or the like, for example.

Figure 4D:
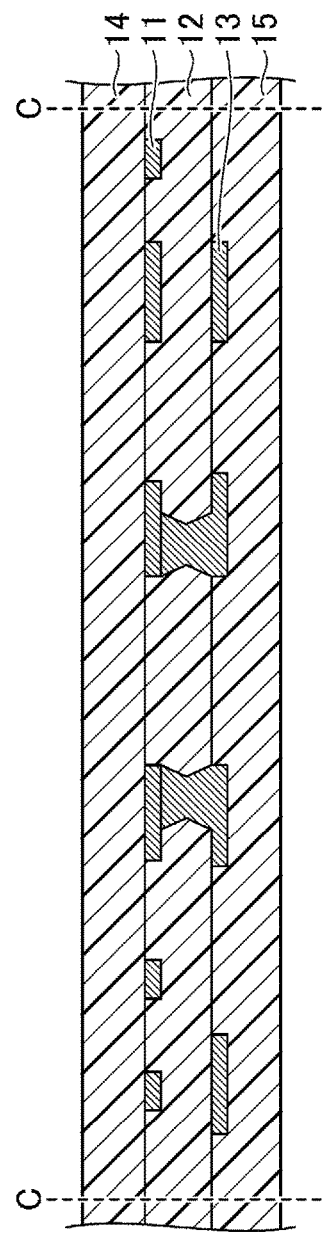

Next, in the process illustrated in FIG. 4D, the insulating layer 14 is formed on one side of the insulating layer 12, so as to cover the surface of the interconnect layer 11 that was in contact with the support 300. In addition, the insulating layer 15 is formed on the other side of the insulating layer 12, so as to cover the interconnect layer 13. Particularly, two semi-cured insulating resin films including a thermosetting resin as a main component thereof, for example, are prepared. Then, the insulating resin films are laminated on one surface and the other surface of the insulating layer 12, respectively, and cured while being subjected to heating and pressing, to form the insulating layer 14 and the insulating layer 15. Alternatively, instead of laminating the insulating resin films, a liquid or paste of the insulating resin may be coated on one surface and the other surface of the insulating layer, and then cured to form the insulating layer 14 and the insulating layer 15. The material used for the insulating layer 14 and the insulating layer 15 and the thicknesses of the insulating layer 14 and the insulating layer 15 may be the same as those of the insulating layer 12, for example. FIG. 4D illustrates the structure in an upside-down state from the state illustrated in FIG. 4C. The same applies to FIG. 5A through FIG. 5C described hereinafter.

Figure 5A:
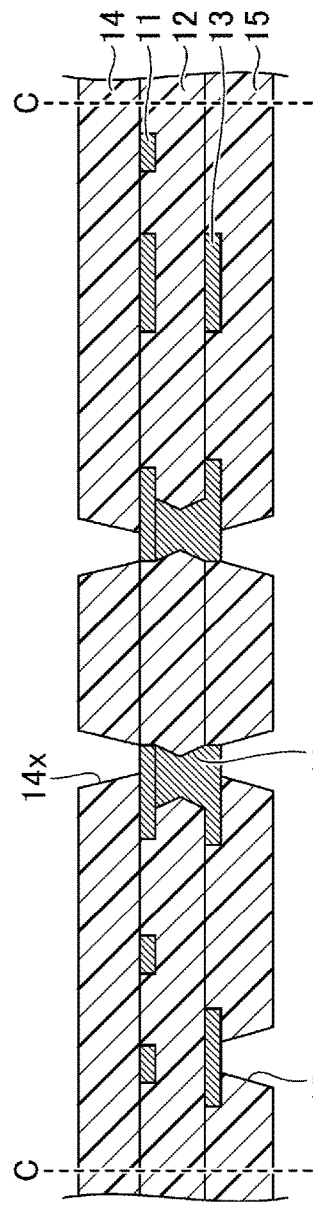
FIG. 5A, FIG. 5B, and FIG. 5C are diagrams illustrating the example of the manufacturing processes of the wiring board according to the first embodiment.

Next, in the process illustrated in FIG. 5A, the via holes 14x are formed in the insulating layer 14, penetrating the insulating layer 14 and exposing the upper surface of the interconnect layer 11. Further, the via holes 15x are formed in the insulating layer 15, penetrating the insulating layer 15 and exposing the lower surface of the interconnect layer 13. The via holes 14x and the via holes 15x can be formed by laser beam machining using a $CO_2$ laser or the like, for example. After forming the via holes 14x and the via holes 15x, a desmear process is preferably performed, as required, to remove resin residue adhered to the surface of the interconnect layer 11 exposed at the bottoms of the via holes 14x and to the surface of the interconnect layer 13 exposed at the bottoms of the via holes 15x.

Figure 5B:
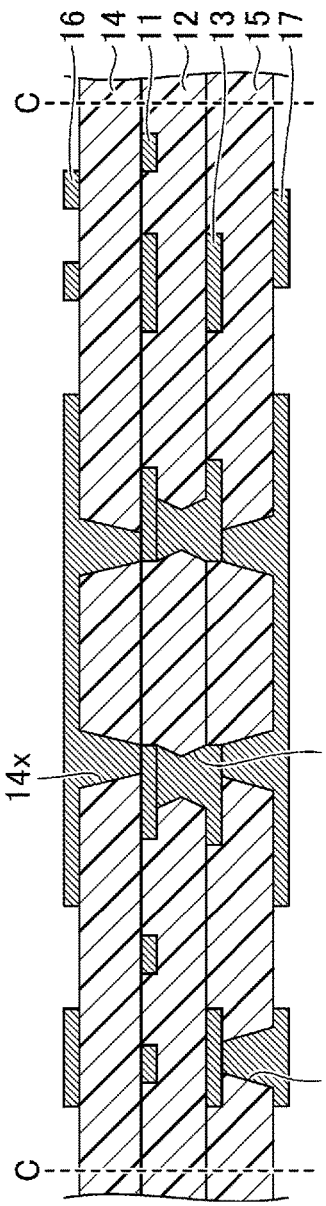

Next, in the process illustrated in FIG. 5B, the interconnect layer 16 is formed on the insulating layer 14. Further, the interconnect layer 17 is formed under the insulating layer 15. The interconnect layers 16 and 17 may be formed by a semi-additive method, for example, similar to the interconnect layer 13.

Figure 5C:
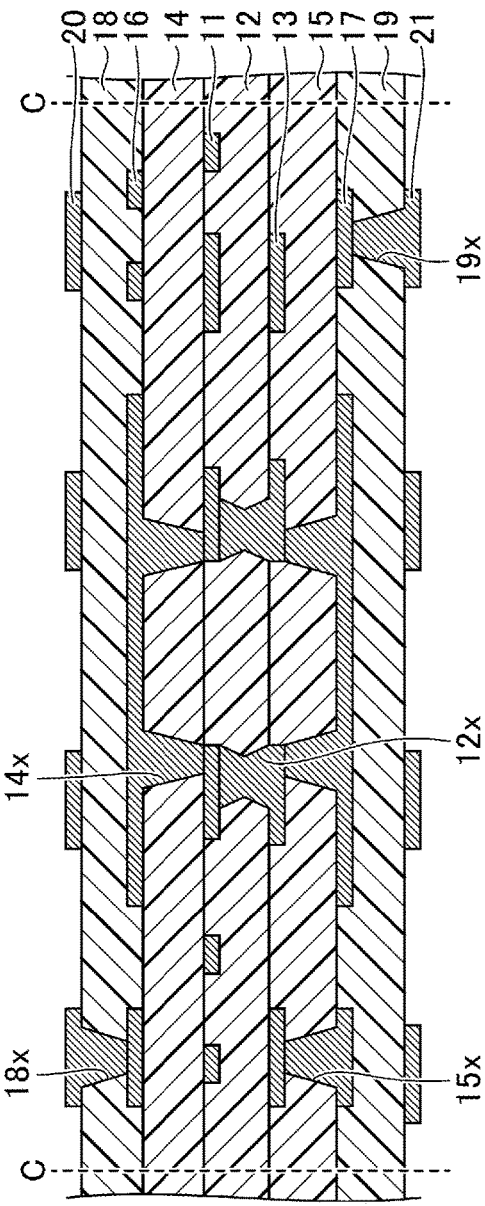
Figure 6A:
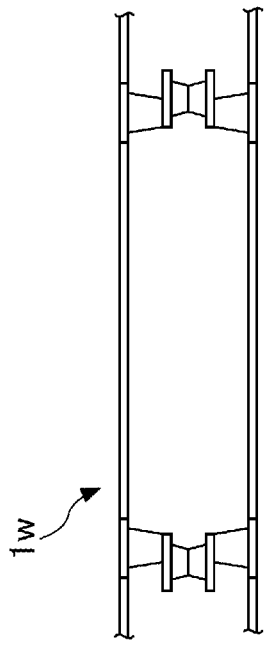
FIG. 6A, FIG. 6B, FIG. 6C, FIG. 6D, and FIG. 6E are diagrams for explaining simulation.
Figure 6C:
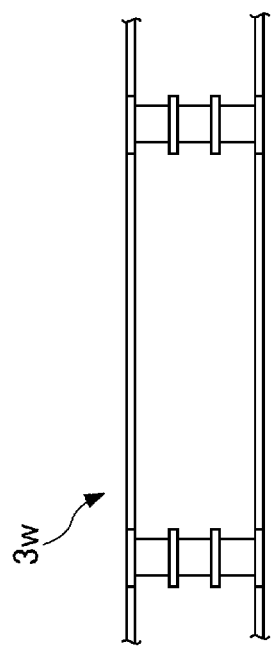
Figure 6B:
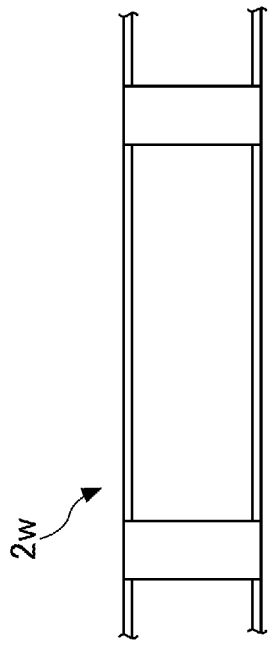
Figure 6E:
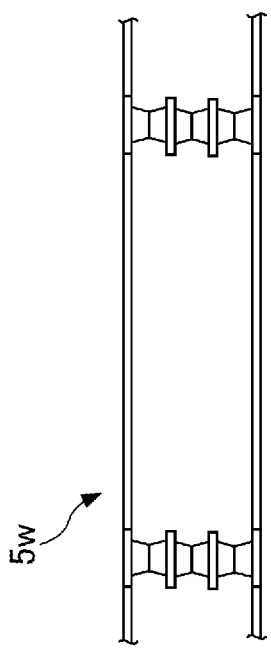
Figure 6D:
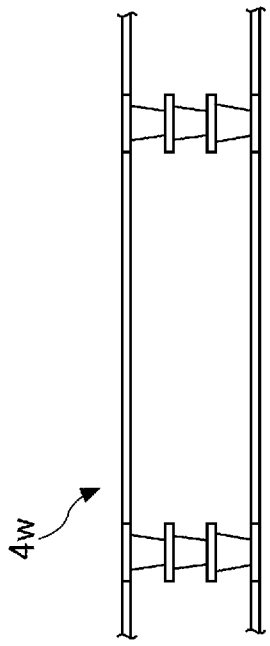

Next, in the process illustrated in FIG. 5C, processes that are the same as the processes of FIG. 4D through FIG. 5B are repeated, to form the insulating layers 18 and 19, the via holes 18x and 19x, and the interconnect layers 20 and 21. Thereafter, the individual wiring board 1 can be obtained by cutting along the broken lines C.

[Simulation]

Simulations of S parameters were performed on the wiring board 1 having the built-in post wall waveguide 1w, and wiring boards having built-in post wall waveguides 2w, 3w, 4w, and 5w as comparative examples. The post wall waveguides 1w, 2w, 3w, 4w, and 5w are designed to be able to transmit radio waves in a range of 150 GHz to 160 GHz. As illustrated in FIG. 6B, FIG. 6C, FIG. 6D, and FIG. 6E, the post wall waveguides 2w, 3w, 4w, and 5w have a shape similar to a rectangular waveguide. The post wall waveguide 2w has columnar portions formed by through holes. The post wall waveguide 3w has columnar portions formed by via interconnects, having a rectangular shape with a constant width in the longitudinal cross sectional view, that are laminated. The post wall waveguide 4w has columnar portions formed by via interconnects, having a trapezoidal shape and facing the same direction in the longitudinal cross sectional view, that are laminated. The post wall waveguides 5w has columnar portions formed by via interconnects, having an hourglass shape with a narrowed width at a center along the thickness direction in the longitudinal cross sectional view, that are laminated. In the post wall waveguides 3w, 4w, and 5w, the center axes of the laminated via interconnects coincide with one another.

Figure 7A:
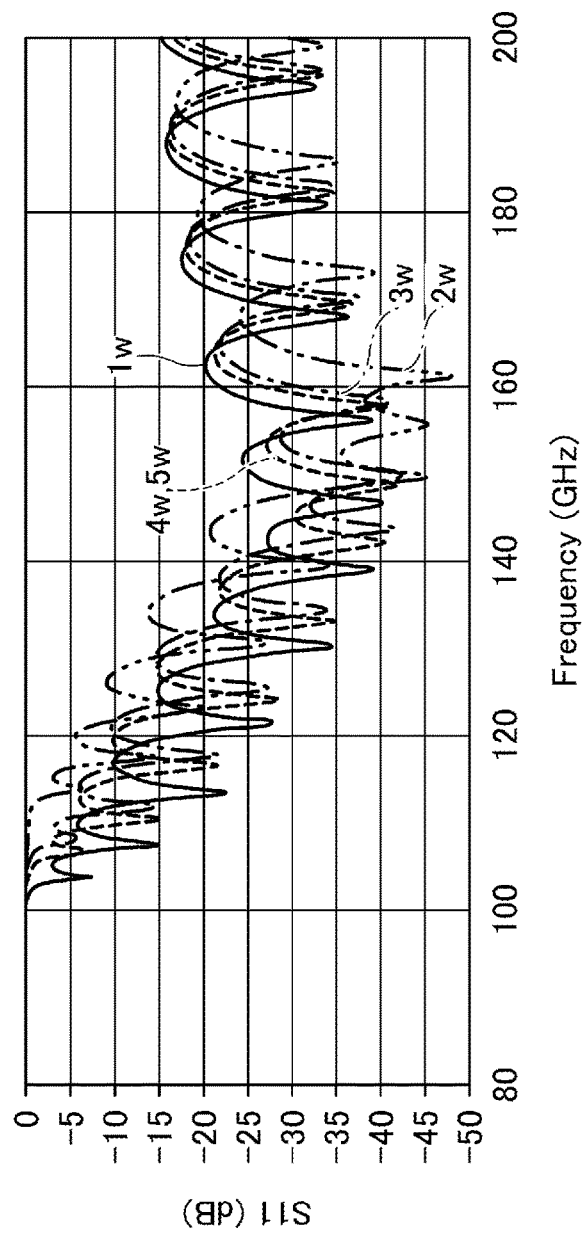
FIG. 7A and FIG. 7B are diagrams illustrating simulation results.
Figure 7B:
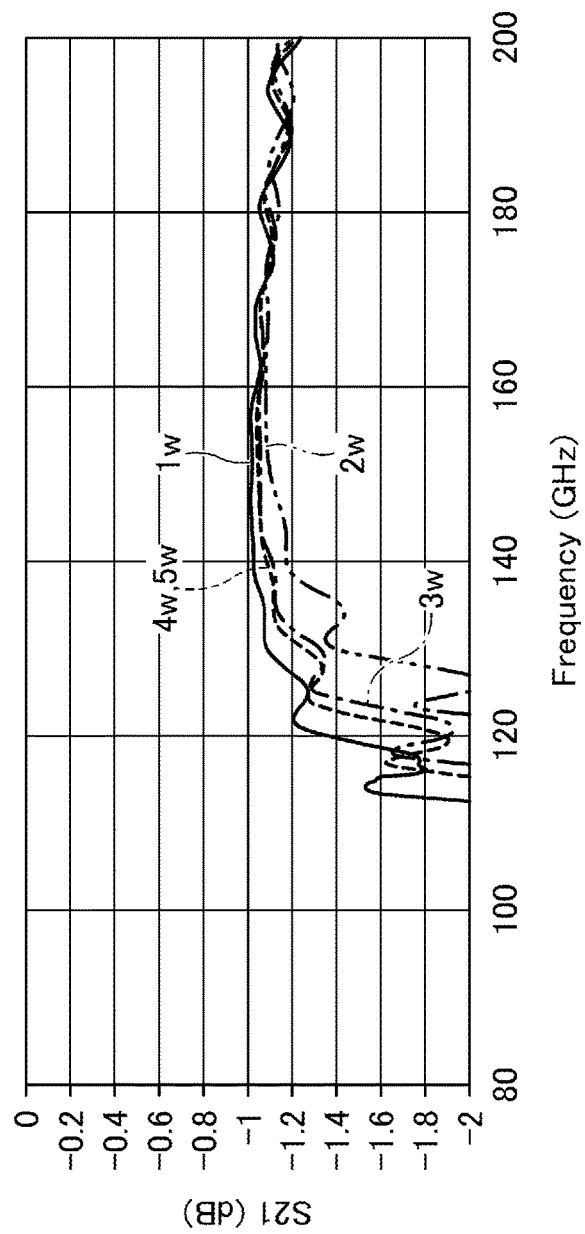

FIG. 7A and FIG. 7B are diagrams illustrating the transmission characteristics of a high-frequency signal of each of the post wall waveguides illustrated in FIG. 6A, FIG. 6B, FIG. 6C, FIG. 6D, and FIG. 6E, and illustrate the simulation results of the S parameters normalized at 120Ω. FIG. 7A illustrates reflection characteristics S(11) in dB vs. Frequency in GHz, and FIG. 7B illustrates transmission characteristics S(21) in dB vs. Frequency in GHz. From FIG. 7A, the reflection characteristics in the range of 150 GHz to 160 GHz are slightly better for the post wall waveguide 2w, but no substantial differences are observed among the post wall waveguides 1w, 3w, 4w, and 5w. On the other hand, from FIG. 7B, the transmission characteristics in the range of 150 GHz to 160 GHz are best for the post wall waveguide 1w.

As described above, it was found from the simulations that the transmission characteristics were improved for the post wall waveguides 1w having the shape close to the circular waveguide, when compared to the transmission characteristics for the post wall waveguides 2w through 5w having the shape close to the rectangular waveguide.

Modification of First Embodiment

In the built-in post wall waveguide of the wiring board according to modifications of the first embodiment, examples that are described have via interconnects at the columnar portions having a laminated structure different from that of the first embodiment. In the modifications of the first embodiment, a description of the constituent elements that are the same as those of the first embodiment may be omitted.

Figure 8A:
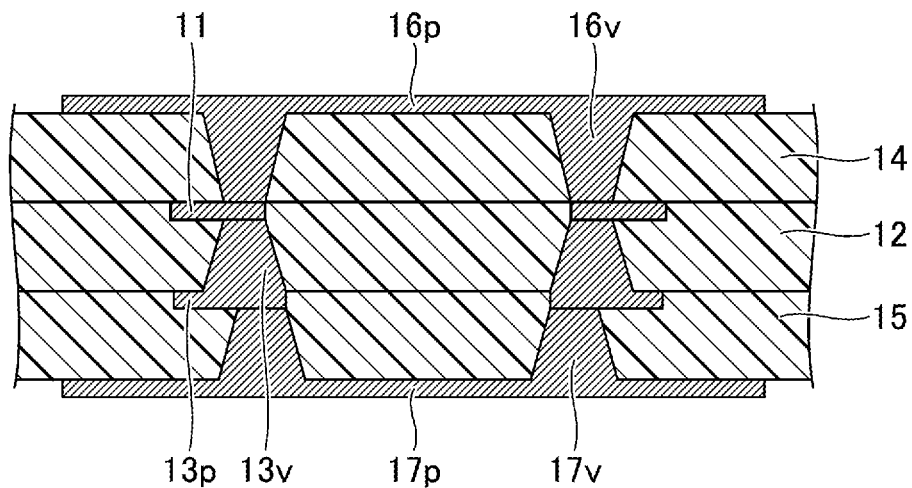
FIG. 8A and FIG. 8B are cross sectional views illustrating an example of the wiring board according to a first modification of the first embodiment.
Figure 8B:
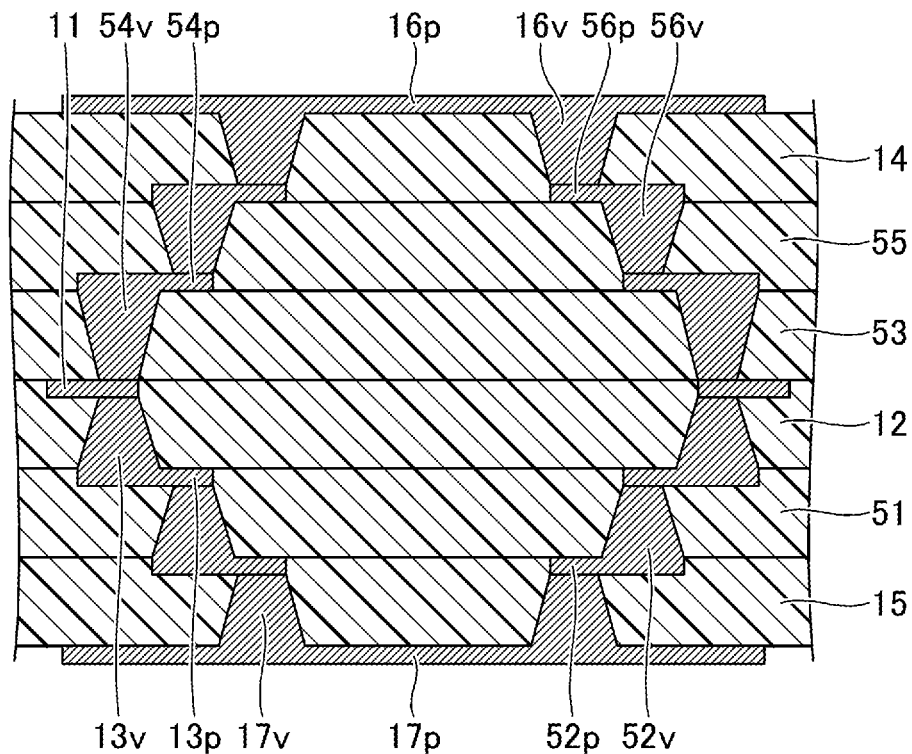

FIG. 8A and FIG. 8B are cross sectional views illustrating the wiring board according to a first modification of the first embodiment, and are longitudinal cross sectional views of the post wall waveguide and the vicinity thereof similar to FIG. 1B. In FIG. 8A, the shape of the via interconnects 13v is different from that of FIG. 1B. In FIG. 8A, the via interconnects 13v have a truncated cone shape having a diameter at the insulating layer 15 larger than a diameter at the lower surface of the interconnect layer 11. In the case of the structure illustrated in FIG. 8A, the post wall waveguide having a shape close to the circular waveguide can also be achieved, and thus, the transmission characteristics of the radio waves can be improved.

In FIG. 8B, three insulating layers are added to the structure of FIG. 1B. Particularly, an insulating layer 51 is inserted between the insulating layer 12 and the insulating layer 15. The insulating layer 51 includes interconnect patterns 52p including via reception pads, and via interconnects 52v. The via interconnects 52v have a truncated cone shape having a diameter at the insulating layer 15 larger than a diameter at the lower surface of the interconnect patterns 13p.

Insulating layers 53 and 55 are inserted between the insulating layer 12 and the insulating layer 14. The insulating layer 53 includes interconnect patterns 54p including via reception pads, and via interconnects 54v. The via interconnects 54v have an inverted truncated cone shape having a diameter at the insulating layer 55 larger than a diameter at the upper surface of the interconnect layer 11. The insulating layer 55 includes interconnect patterns 56p including via reception pads, and via interconnects 56v. The via interconnects 56v have an inverted truncated cone shape having a diameter at the insulating layer 14 larger than a diameter at the upper surface of the interconnect patterns 54p. In the case of the structure illustrated in FIG. 8B, the post wall waveguide having a shape close to the circular waveguide can also be achieved, and thus, the transmission characteristics of the radio waves can be improved. In addition, the post wall waveguide having a shape closer to the circular waveguide can be achieved, by suitably increasing the number of insulating layers that are laminated.

Figure 9A:
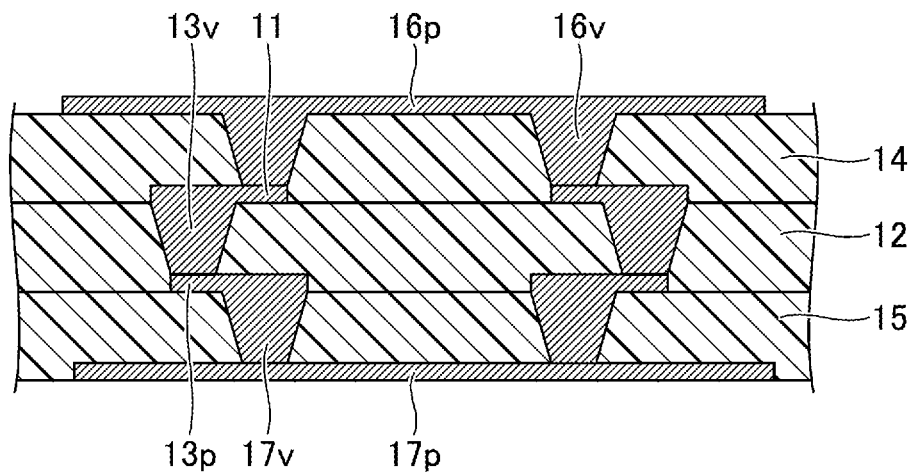
FIG. 9A and FIG. 9B are cross sectional views illustrating the example of the wiring board according to the first modification of the first embodiment.
Figure 9B:
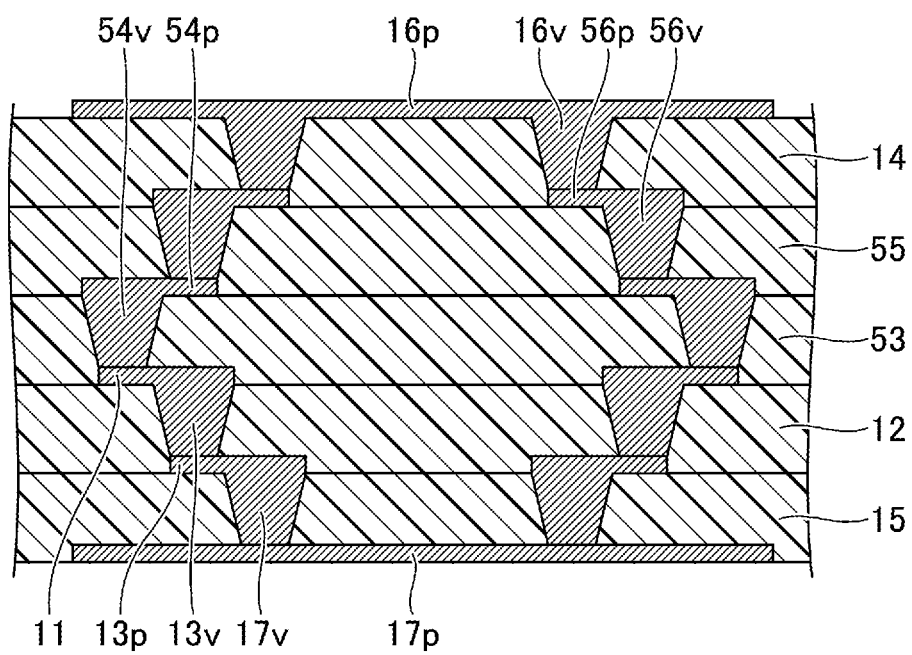

FIG. 9A and FIG. 9B are cross sectional views illustrating the wiring board according to a second modification of the first embodiment, and are longitudinal cross sectional views of the post wall waveguide and the vicinity thereof similar to FIG. 1B. In FIG. 9A, the shapes of the via interconnects 13v and 17v are different from those of FIG. 8A. In FIG. 9A, the via interconnects 13v have an inverted truncated cone shape having a diameter at the insulating layer 14 larger than a diameter at the upper surface of the interconnect patterns 13p. The via interconnects 17v have an inverted truncated cone shape having a diameter at the insulating layer 12 larger than a diameter at the upper surface of the conductor 17p. In the case of the structure illustrated in FIG. 9A, the post wall waveguide having a shape close to the circular waveguide can also be achieved, and thus, the transmission characteristics of the radio waves can be improved.

FIG. 9B differs from FIG. 8B in that the insulating layer 51 is omitted in FIG. 9B. In FIG. 9B, the via interconnects 13v have an inverted truncated cone shape having a diameter at the insulating layer 53 larger than a diameter at the upper surface of the interconnect patterns 13p. The via interconnects 17v have an inverted truncated cone shape having a diameter at the insulating layer 12 larger than a diameter at the upper surface of the conductor 17p. In the case of the structure illustrated in FIG. 9B, the post wall waveguide having a shape close to the circular waveguide can also be achieved, and thus, the transmission characteristics of the radio waves can be improved. In addition, the post wall waveguide having a shape closer to the circular waveguide can be achieved, by suitably increasing the number of insulating layers that are laminated.

As illustrated in FIG. 9A and FIG. 9B, even in a case where all of the via interconnects have approximately the same shape, the post wall waveguide having a shape close to the circular waveguide can be achieved by laming the via interconnects in a staircase shape.

Although the preferred embodiments have been described above in detail, the present invention is not limited to the above described embodiments, and various modifications and substitutions can be made to the above described embodiments without departing from the scope of the present invention.

For example, in the above described embodiment, the ends of the via interconnects are unevenly distributed in a region close to the transmission path and connected to upper surfaces of the via reception pads of the interconnect layer, but a configuration illustrated in FIG. may be employed instead. An upper portion of FIG. 10 is a cross sectional view, and a lower portion of FIG. 10 is a partial plan view illustrating a via reception pad of the interconnect pattern 13p. In lower portion of FIG. 10, a region of the upper surface of the via reception pad connected to the lower end of the via interconnect 13v is indicated by a broken line, and a region of the lower surface of the via reception pad connected to the upper end of the via interconnect 17v is indicated by a one-dot chain line.

As illustrated in FIG. 10, the via interconnect is connected to the via reception pad formed larger than a regular size, but the same effects as the above described embodiment can be obtained without intentionally and unevenly distributing the ends of the via interconnect. Thus, the wiring board can be stably manufactured without requiring delicate alignments.

Figure 11A:
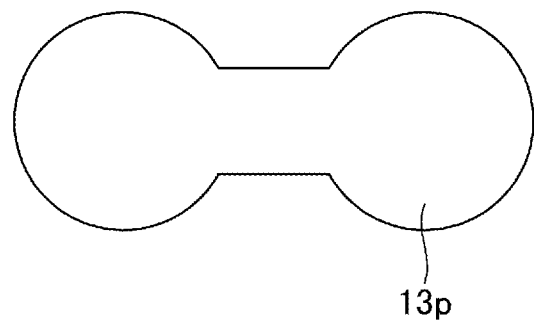
FIG. 11A, FIG. 11B, and FIG. 11C are diagrams illustrating the example of the via reception pad formed larger than the regular size.
Figure 11B:
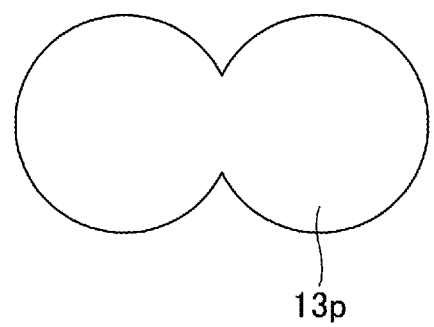
Figure 11C:
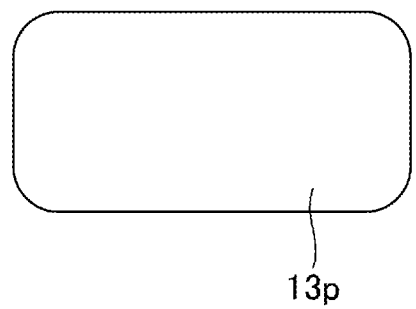

Examples of the via reception pads larger than the regular size include circular and elliptical pads, for example. Moreover, the via reception pad of the interconnect pattern 13p is larger than the regular size and may have various shapes, such as a dumbbell shape illustrated in FIG. 11A, a gourd shape illustrated in FIG. 11B, and a square shape illustrated in FIG. 11C, for example. Further, two via reception pads having the regular size may be connected by an interconnect and used, without forming a via reception pad larger than the regular size.

Accordingly to each of the embodiments described above, it is possible to provide a wiring board that can improve radio wave transmission characteristics of a post wall waveguide integrated in the wiring board.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    a built-in post wall waveguide having a region, surrounded by two mutually opposing conductors and a first post wall and a second post wall connecting the two conductors, and serving as a transmission path for electromagnetic waves, wherein:
    the two conductors are disposed to oppose each other with three or more insulating layers interposed therebetween,
    the first post wall has a configuration including first columnar portions, formed by a laminate of via interconnects penetrating the three or more insulating layers, arranged at predetermined intervals in a first direction in which the electromagnetic waves are transmitted,
    the second post wall has a configuration including second columnar portions, formed by a laminate of via interconnects penetrating the three or more insulating layers, arranged at predetermined intervals in the first direction,
    in a cross sectional view taken in a second direction perpendicular to the first direction, the via interconnects forming the first columnar portion and the second columnar portion are laminated in a staircase shape, and an interval between adjacent first via interconnects opposing each other in one of the three or more insulating layers not in contact with one of the two conductors is wider than an interval between adjacent second via interconnects opposing each other in two of the three or more insulating layers in contact with the two conductors, respectively, and in the cross sectional view, each of the adjacent first via interconnects has a width that gradually narrows from wide portions located at both mutually opposite surfaces of the one of the three or more insulating layers toward a narrow portion located at a center along a thickness direction.

2. The wiring board as claimed in claim 1, wherein, in the cross sectional view, a distance between the adjacent first via interconnects gradually increases toward the center along the thickness direction of the wiring board.

3. The wiring board as claimed in claim 1, wherein, in the cross sectional view, the second via interconnects have a width that narrows as a distance from the two conductors in contact with the second via interconnects increases, respectively.

4. The wiring board as claimed in claim 3, wherein, in the cross sectional view, surfaces of the second via interconnects opposing the transmission path are inclined from ends of the second via interconnects located at the two conductors toward the narrow portion of the first via interconnects at inclination angles identical to inclination angles of surfaces of the first via interconnects opposing the transmission path and connecting to the surfaces of the second via interconnects, respectively.

5. The wiring board as claimed in claim 1, wherein, in the cross sectional view, ends of the via interconnects forming the first columnar portion and the second columnar portion are unevenly distributed in a region close to the transmission path and connected to upper surfaces of via reception pads.

6. The wiring board as claimed in claim 1, wherein, in the cross sectional view, the first columnar portion and the second columnar portion have a symmetrical structure such that shapes of the first columnar portion and the second columnar portion are symmetrical on opposite sides of a first centerline parallel to the second direction, the first centerline being located at a center between the first columnar portion and the second columnar portion along a third direction perpendicular to both the first direction and the second direction.

7. The wiring board as claimed in claim 6, wherein, in the cross sectional view, the first columnar portion and the second columnar portion have a symmetrical structure such that shapes of the first columnar portion and the second columnar portion are symmetrical on opposite sides of a second centerline parallel to the third direction, the second centerline passing through a first midpoint along a height of the first columnar portion along the second direction and a second midpoint along a height of the second columnar portion along the second direction.

* * * * *